United States Patent
Young

(10) Patent No.: US 7,672,839 B2
(45) Date of Patent: Mar. 2, 2010

(54) DETECTING AUDIO SIGNAL ACTIVITY IN A COMMUNICATIONS SYSTEM

(75) Inventor: Robert Young, Suffolk (GB)

(73) Assignee: Cambridge Silicon Radio Limited, Cambridge (GB)

( * ) Notice: Subject to any disclaimer, the term of this patent is extended or adjusted under 35 U.S.C. 154(b) by 528 days.

(21) Appl. No.: 11/571,031

(22) PCT Filed: Jun. 24, 2005

(86) PCT No.: PCT/IB2005/002039

§ 371 (c)(1),
(2), (4) Date: Feb. 14, 2007

(87) PCT Pub. No.: WO2006/003502

PCT Pub. Date: Jan. 12, 2006

(65) Prior Publication Data

US 2008/0288247 A1    Nov. 20, 2008

(30) Foreign Application Priority Data

Jun. 28, 2004  (GB) ................. 0414420.0

(51) Int. Cl.
  *G10L 11/02*   (2006.01)
  *H03M 7/34*    (2006.01)
(52) U.S. Cl. .......... 704/215; 704/230; 341/51; 341/77; 375/345
(58) Field of Classification Search ........... 704/210, 704/211, 212, 215, 225, 229, 230; 341/51, 341/77; 375/345
See application file for complete search history.

(56) References Cited

U.S. PATENT DOCUMENTS

| | | | | | |
|---|---|---|---|---|---|
| 3,703,688 | A | * | 11/1972 | Flanagan | 341/77 |
| 3,815,033 | A | * | 6/1974 | Tewksbury | 341/143 |
| 3,909,532 | A | * | 9/1975 | Rabiner et al. | 704/215 |
| 4,411,003 | A | * | 10/1983 | Su | 375/252 |
| 4,449,190 | A | | 5/1984 | Flanagan et al. | |
| 4,811,325 | A | * | 3/1989 | Sharples et al. | 369/85 |
| 5,155,743 | A | * | 10/1992 | Jacobs | 375/247 |
| 5,276,764 | A | * | 1/1994 | Dent | 704/200 |
| 5,357,609 | A | * | 10/1994 | Sellers et al. | 370/286 |
| 6,363,343 | B1 | | 3/2002 | Horos | |
| 7,013,117 | B2 | * | 3/2006 | Darabi | 455/240.1 |
| 7,073,113 | B2 | * | 7/2006 | Sayed et al. | 714/746 |
| 2004/0128606 | A1 | * | 7/2004 | Sayed et al. | 714/746 |

FOREIGN PATENT DOCUMENTS

EP          0 915 563 A3    1/2001

OTHER PUBLICATIONS

Jayant, N.S.& Noll, P., "Digital Coding of Waveforms," 1984, Prentice-Hall Signal Processing Series, Englewood Cliffs, NJ , p. 372.
European Patent Office Communication, Aug. 22, 2007.

* cited by examiner

*Primary Examiner*—Martin Lerner
(74) *Attorney, Agent, or Firm*—Novak Druce DeLuca + Quigg LLP

(57) ABSTRACT

A method for detecting the presence or absence of an audio signal in a communications system in which an audio signal is encoded by a delta modulation encoding algorithm, and in which a step size parameter is adapted according to characteristics of the encoded signal, the method comprising determining based on the magnitude of the step size parameter whether the encoded signal represents audio activity, and adapting the operation of the communication system based on that determination.

32 Claims, 2 Drawing Sheets

DETECTING AUDIO SIGNAL ACTIVITY IN A COMMUNICATIONS SYSTEM

The present invention relates to the detection of encoded audio signals in communications systems, and in particular to delta modulation encoded signals.

In audio communications systems it is typical for audio signals to be encoded prior to transmission across a communications link. Encoding a signal can improve its quality when it is received at a receiver, since a communications medium may be subject to signal degradations. In addition, a communications medium is generally of limited frequency bandwidth, and the encoding scheme can be selected to improve the effective signal bandwidth.

Common encoding techniques involve sampling an audio signal to provide a digital representation of the sampled portion of the signal, and then digitally encoding the sampled portion.

An example of a common encoding technique is delta modulation. This involves repeatedly performing digital sampling of an audio signal, and encoding the changes in signal amplitude from sample to sample. In the simplest example, the encoded signal represents whether an audio sample is higher or lower in amplitude than the previous sample. This type of encoding can be represented by the following equation:

$$x(n)=x(n-1)+(2 \cdot b(n)-1) \cdot \delta \quad (1)$$

where $x(n)$ is an audio sample; $x(n-1)$ is the previous audio sample; $b(n)=0$ or $1$ and represents a bit of data being transmitted in the audio signal; and $\delta$ is known as the step size.

The step size $\delta$ indicates the size of the positive or negative amplitude adjustment for a given sample ($x(n)$) compared with the preceding sample ($x(n-1)$).

Using equation (1), the audio sample $x(n)$ can be reconstructed from the previous sample $x(n-1)$ at a decoder.

In some encoding schemes, the step size $\delta$ may be made to adapt according to characteristics of a signal being encoded or decoded. This is desirable since it allows efficient representation of signals of widely varying amplitudes and frequencies. For instance, when large amplitude or high frequency signals are to be encoded or decoded, the step size may become larger such that larger changes in signal amplitude from sample to sample may be represented. A particular example of a delta modulation encoding scheme using an adaptive step size is Continuous Variable Slope Delta Modulation (CVSD). There are many variations of the basic concept of using an adaptive step size, for example the use of multiple bits to encode accurate information about the change in amplitude between samples, such that more information may be transmitted than simply whether one sample is higher or lower than the previous sample.

It should be noted that the step size parameter itself need not be transmitted over a communications medium. Instead, a transmitter and a receiver could each use the same step size parameter adaptation algorithm to determine a current step size parameter on the basis of the values $b(n)$ in a transmitted signal.

In applications that involve transmission of speech or other audio data over a communications system (which may be wired or wireless), it is a common requirement that the gain of an input or output device, such as a microphone or a speaker, should be automatically adjustable. This is desirable so that the amplitude of an audio signal can be optimised at a subsequent stage of the communications path. For example, in a portable wireless application, as shown in FIG. 1, the gain of a microphone 1b could be adjusted according to the strength of a speech signal to be transmitted from a handset 1, to avoid overloading the microphone amplifier(s) and to maximise the signal-to-noise ratio. Similarly, the gain of the handset's speaker 1a can be adjusted according to characteristics of an audio signal received by the handset, so that the quality of the signal output from the speaker is optimised.

Furthermore, in a two-way communications system such as that shown in FIG. 1, it may be advantageous to adjust the gain of a microphone input 1b at one end 1 of a communications link 3 according to the presence and amplitude of a speech signal at the speaker output 1a of the same end of the link, for example to minimise feedback 4 of the speaker through the microphone, which could otherwise cause an annoying echo at the other end of the link 2.

An example of a communications system is Bluetooth. This system utilises CVSD encoding, as described above. In Bluetooth systems one implementation option is that when no data can be detected at a receiver this is interpreted as silence and no audio signal is output from the receiver. This can be exploited at a Bluetooth transmitter in that when a person stops speaking into a microphone at the transmitter, the transmitter can detect this and stop transmitting data. This can have the advantage of saving power at the transmitter. Microphone gain can be adjusted in a similar way, in Bluetooth and other systems, so that when a person stops speaking into a microphone its gain will automatically be reduced. Such an arrangement is known as a VOGAD, or voice operated gain adjusting device.

In order to control the gain at various points in a communications system using known techniques, it is necessary to measure the amplitude of a transmitted signal. This generally involves the processing of signal samples, which can require significant computational capacity. Moreover, gradual variations in signal amplitude which may be present in the background can distort calculations of signal amplitude. Fixed offsets can create similar distortion.

A further problem with known techniques for monitoring signal amplitudes is the bursty nature of audio signals, and in particular speech data. Within a period of apparently continuous speech, there will in fact be short periods of low signal energy (silence) in between periods of high signal energy, as can be seen from FIG. 2. This can mean that when a sample of the audio signal is taken the sample will indicate a low signal energy corresponding to silence, when in fact the signal as a whole represents speech. Therefore, an instantaneous sample of an audio signal cannot reliably be used as an indicator of whether or not the signal represents speech.

A delta modulation step size adaptation algorithm can partially overcome this problem. The sampled signals will smooth out some of the burst nature of the audio signal.

The speed of adaptation of the step size will affect the accuracy of the encoded signal. Typically, methods used to change step sizes in dependence on characteristics of an audio signal will change the step size relatively slowly, for example with a time constant of several milliseconds. The faster the adaptation time constant, the more accurate the encoding.

The concept of "attack" and "decay" times is important in communications applications requiring adaptive gain control. An attack time is the response time to an increase in signal energy corresponding to the start of a speech or other audio signal. A decay time is the response time to a decrease in signal energy corresponding to gaps in speech or other audio signals. In many applications, such as mobile communications, it is advantageous to have a relatively short attack time and a relatively long decay time. In this way, a system can respond quickly to the start of a signal, so that, for example, no speech data is lost while the system adapts, and the system is relatively invariant to short gaps in signal energy, for example between words in a speech signal.

The present invention can help to provide a computationally efficient method for detecting the presence or absence of an audio signal. Embodiments of the method can be relatively invariant to fixed offsets and low frequency disturbances superimposed on a desired audio signal. Embodiments of the method can at least partly overcome the problems associated with the burstiness of audio signals.

In accordance with a first aspect of the present invention there is provided a method for detecting the presence or absence of audio activity in a communications system in which an audio signal is encoded by a delta modulation encoding algorithm, and in which a step size parameter is adapted according to characteristics of the encoded signal, the method comprising determining based on the magnitude of the step size parameter whether the encoded signal represents speech activity, and adapting the operation of the communication system based on that determination.

The encoded signal is suitably determined to represent audio activity when the magnitude of the step size parameter is above a first threshold. The encoded signal is suitably determined not to represent audio activity when the magnitude of the step size parameter is below the first threshold. Alternatively, when the encoded signal has been determined to represent audio activity the encoded signal may be subsequently determined not to represent audio activity when the magnitude of the step size parameter is below a second threshold which is lower than the first threshold.

The method preferably comprises analysing the audio signal, and determining the step size parameter based on the analysis of the signal. Preferably the step size parameter is sampled regularly to produce an output signal representative of determined step size parameters. The sampling rate may be less than 1 kHz, more preferably less than 200 Hz.

The method preferably comprises the step of applying a low pass filter to the output signal. The low pass filter is preferably a non-linear filter.

Preferably the encoded signal is formed by encoding the audio signal at a transmitter.

The determining step may be performed at a receiver or at a transmitter.

The method may comprise transmitting data representing the audio signal when the signal is determined to represent audio activity, and otherwise not transmitting data representing the audio signal.

Where the determining step is performed at a transmitter, the transmitter may include a microphone whereby the audio signal is detected, and the method may comprise applying a lower gain to signals detected by the microphone when the encoded signal formed by encoding immediately preceding audio signals is determined not to represent audio activity than when the audio signal is determined to represent audio activity.

The receiver may include an audio output device whereby the audio signal is output, and the method may comprise applying a lower gain to signals passed to the output device when the audio signal is determined not to represent audio activity than when the audio signal is determined to represent audio activity.

The communications system may be a Bluetooth system. The communication system preferably operates according to a protocol wherein the non-transmission of an audio signal indicates silence.

According to a second aspect of the invention there is provided method for estimating the energy of an audio signal in a communications system in which a signal is encoded by a delta modulation encoding algorithm, and in which a step size parameter is adapted according to characteristics of the signal, the method comprising estimating based on the step size parameter the energy of the signal.

According to a third aspect of the invention there is provided apparatus for detecting the presence or absence of an audio signal in a communications system in which an audio signal is encoded by a delta modulation encoding algorithm, and in which a step size parameter is adapted according to characteristics of the encoded signal, the apparatus comprising means for determining based on the magnitude of the step size parameter whether the encoded signal represents audio activity, and means for adapting the operation of the communication system based on that determination.

The present invention will now be described by way of example with reference to the drawings.

Figure 1:
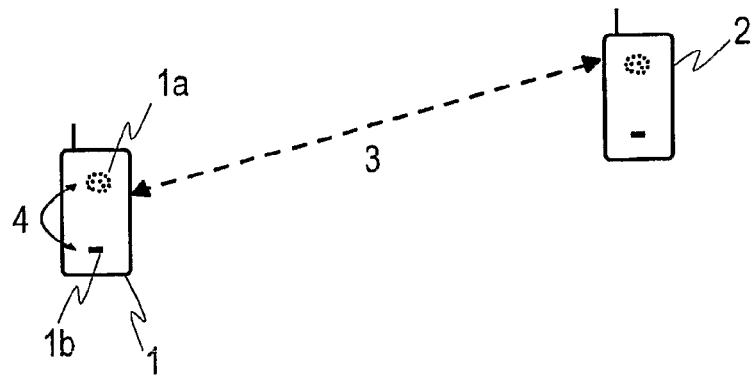
FIG. 1 shows a typical two-way communications system.
Figure 2:
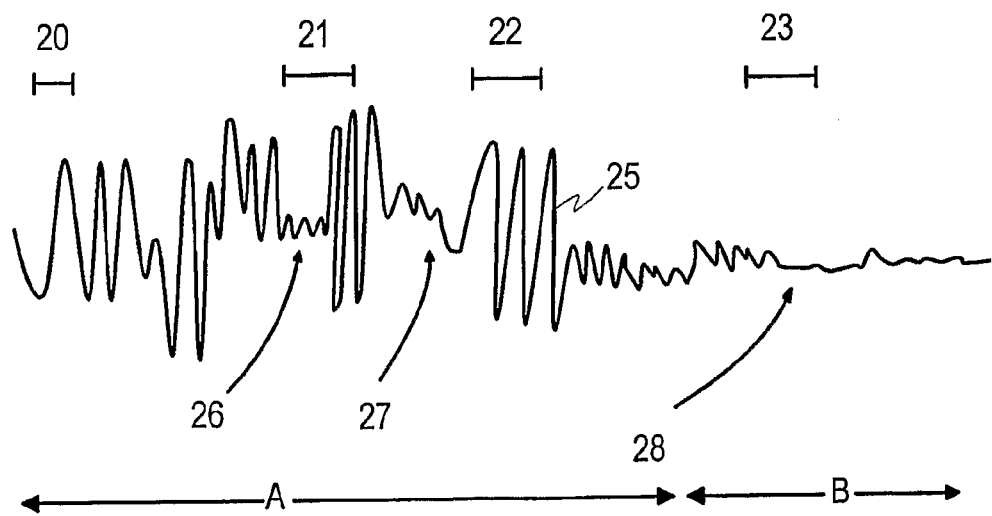
FIG. 2 is a schematic representation of a speech signal.

FIG. 2 shows a representation of a speech signal 25. Such a speech signal might be transmitted in a communications system such as that shown in FIG. 1, or in a one-way system such as a TV or radio broadcast.

The section A of the signal represents speech that is desired to be transmitted. Section B represents the period after the end of a portion of speech, and this part of the signal is merely background noise. It is desirable in communications systems that the gain of input or output devices should be automatically adjustable in response to a speech signal. In the present example, the signal 25 may be spoken into the microphone of a handset 1b to be transmitted to handset 2. In this case, the gain of the microphone 1b would ideally be higher during section A while speech is spoken into the microphone than it would be during section B when the microphone is not being spoken into, so that power can be saved while there is no speech to be transmitted. Conversely, it may be that the signal 25 is being received at handset 1 and output at speaker 1a. In this case, it would be desirable for the gain of the speaker to be greater when the speaker is outputting section A than when it is outputting section B in order to optimise the sound quality. In addition, it may be advantageous to discontinue transmission from handset 1 at the time when the speech section A ends.

In delta modulation encoding schemes, a signal to be encoded will typically be sampled at a rate of about 8 kHz. In many practical cases, delta modulation is applied to an up-sampled version of an original signal. For example, in Bluetooth the signal is interpolated to 64 kHz from an original audio sampling rate of 8 kHz. The values b(n) can then be transmitted at this higher rate. Subsequently, at the receiver the decoded signal can be decimated from the higher rate to the required audio sampling rate. For each sample (or less often) a step size parameter $\delta$ will be determined and encoded, for example in accordance with equation (1). Considering the exemplary signal 25 of FIG. 2, in section A the $\delta$ value will be relatively high on average, since there is typically a large change in amplitude of the signal between each sample. Conversely, in section B it will be relatively low since there is on average a small change in signal amplitude between each sample.

The inventors of the present invention have appreciated that the step size $\delta$ itself may be used as an indicator of whether or not a speech signal is present. For example, the relatively high δ values in section A may be taken as an indication that speech is present, whereas the low δs in section B may be taken as an indication that the only audio signal present corresponds to background noise. By determining from the δ values whether or not a speech signal is present, computational load can be reduced compared with known systems because no separate processing of the audio signals is required: the processing that would otherwise take place for encoding of the audio signal may itself be used to indicate whether or not audio is present. A further advantage of embodiments of the present invention is that fixed offsets and low frequency disturbances superimposed on an audio signal are unlikely to distort the indication of the presence or absence of a speech signal since step size δ is invariant to these factors.

According to one embodiment a threshold of step size parameter may be applied, such that when the threshold 41 is crossed gain of input or output devices may be automatically adjusted, and alternatively or additionally transmission may be started or halted.

Figure 3:
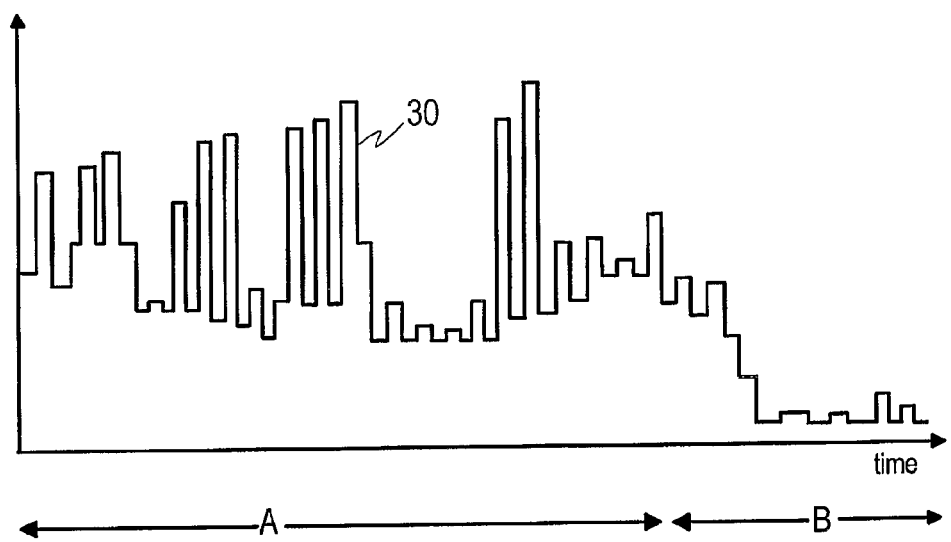
FIG. 3 is a representation of a delta modulation encoded speech signal.

FIG. 3 shows a delta modulated version 30 of audio signal 25. Signal 30 represents x(n) as defined in equation (1).

Figure 4:
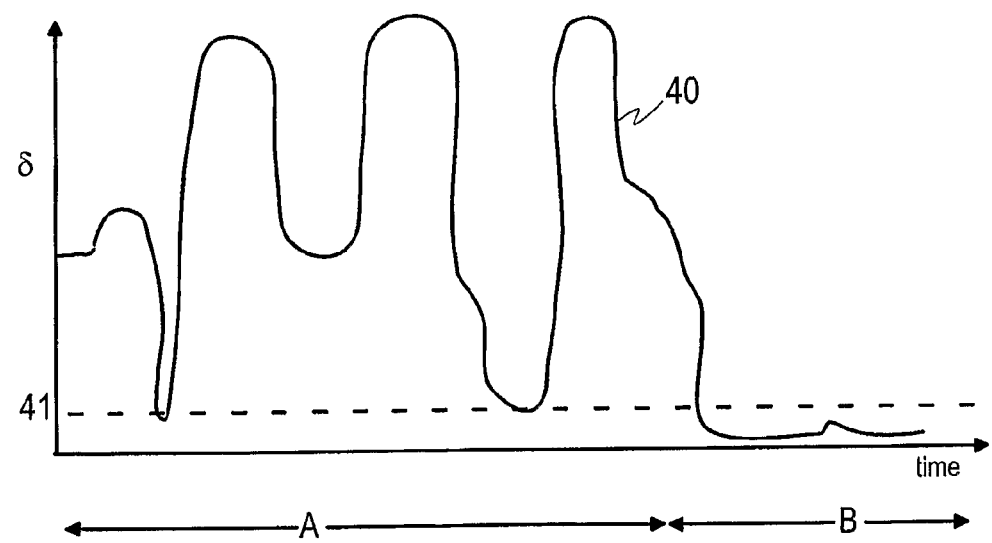
FIG. 4 is a graph of step size parameter against time.

FIG. 4 is a graph showing detected step size δ against time. The graph represents step sizes detected by sampling encoded signal 30. It can be seen from FIGS. 3 and 4 that δ will be higher when speech is present, and therefore signal amplitude is higher (section A) and lower when only background noise is present, and therefore signal amplitude is lower (section B). The step size falls below the threshold 41 just after section A ends, that is when the speech signal becomes merely background. The threshold may represent the trigger for transmission to be started or discontinued, and/or it may represent the trigger for adjusting device gain. In an alternative embodiment, two thresholds may be used to provide hysteresis. In the example shown in FIG. 4, the step size also falls below the threshold at a point before the speech ends, however, depending on the method used for triggering the halting of transmission or the adjustment of gain, this point may be ignored as δ falls below the threshold only for a short time. Embodiments of the invention that allow for such sudden dips or peaks in δ to be ignored are discussed below.

In one embodiment of the invention, the step size δ is used to provide an estimate of the energy of an audio signal. As explained above with reference to FIGS. 2 and 3, δ will be relatively high when the average amplitude (and hence the energy) of a signal is high. By using the step size to provide an estimate of signal energy the problems of fixed offsets and low frequency disturbances are overcome.

Typically, techniques used for adapting step size in accordance with signal amplitude will change the step size relatively slowly, for example with a time constant of several milliseconds. Therefore in many situations there is unlikely to be any advantage to be gained by monitoring the step size very frequently. A sampling rate of around 100 Hz will typically be sufficient to detect the presence or estimate the energy of a signal to good precision and without losing significant information. Since the sampling rate may be relatively low compared with known techniques and compared with the typical sampling rate for encoding audio signals (around 8 kHz), computational load is correspondingly low.

It can be seen from FIG. 2 that speech signals can have a bursty nature, as explained above. Although embodiments of the present invention reduce the burstiness of the measured signal by monitoring the step size rather than the underlying signal (see FIGS. 2 and 4), it may be desirable to further smooth the measured signal to give a more reliable indication of the presence of speech or a more reliable estimate of the signal energy. For example, it may be desirable to remove the sudden dip in δ that occurs during section A, as shown in FIG. 4, since this does not represent a termination of speech. To this end, it may be advantageous to perform post-processing techniques on the detected step size parameters. By taking into account relatively long periods of signal, a more reliable energy estimate may be achieved.

In one embodiment, the step size parameter is sampled at a suitable rate to avoid losing significant information, such as 100 Hz, and then transmitted through a low pass filter so that high frequency variations are removed. For speech detection purposes, a single threshold, or alternatively two thresholds to provide hysteresis, can then be applied to the output of the low pass filter. In this way, the burstiness of the resulting signal will be minimised.

A linear or non-linear low pass filter may be used for filtering high frequency variations from the step size parameter signal. However, a non-linear filter is preferred because this can allow for a relatively fast attack time and a relatively slow decay time, whereas a linear filter would have the same response time to an increase in signal energy as to a decrease. As discussed above, it can be advantageous to provide a relatively long decay time.

FIG. 2 illustrates the significance of attack time and decay time lengths. At the onset of speech, shown at the start of section A, it is desirable for the gain of input and/or output devices to be adapted quickly, for example so that the microphone 1b immediately picks up the speech with sufficient gain when a person starts talking into it. The time period 20 in FIG. 2 illustrates a typical attack time. This is relatively short so that as soon as speech starts the gain of the appropriate devices may be adapted accordingly. Conversely, 21, 22 and 23 are typical decay times. These are relatively long so that the short periods of silence in between periods of speech (shown for example at 26 and 27) do not cause device gains to be adapted. The gains will only be modified when the speech ends at 28.

It can thus be seen that it can be advantageous to use non-linear filtering techniques to the step size signal of this embodiment. One example of such a filter has the following characteristics:

$$y(n) = \alpha \cdot y(n-1) + (1-\alpha) \cdot x'(n) \quad (2)$$

$$z(n) = \max(y(n), \beta \cdot z(n-1)) \quad (3)$$

where x'(n) is the nth sample of the step size parameter, y(n) is an intermediate value and z(n) is the nth output of the non-linear filter. The parameter $0 \leq \alpha < 1$ determines the attack constant, where a lower value of α gives a faster attack time. The parameter $0 \leq \beta < 1$ determines the decay time constant, where a lower value of β gives a faster decay time. If β=0, the decay time and the attack time are equal.

The filter described by equations (2) and (3) provides first order filtering during the attack period and second order filtering during the decay period. Many variations of this filter may be suitable, but the objective is to provide a smaller attack time constant than decay time constant so that the post-processing techniques provide a reliable and useful indication of the presence and/or energy of the encoded audio signal, taking into account the typical characteristics of the type of signal.

The applicant draws attention to the fact that the present invention may include any feature or combination of features disclosed herein either implicitly or explicitly or any generalisation thereof, without limitation to the scope of any definitions set out above.

In view of the foregoing description it will be evident to a person skilled in the art that various modifications may be made within the scope of the invention.

The invention claimed is:

1. A method for detecting the presence or absence of audio activity in a communications system in which an audio signal is encoded by a delta modulation encoding algorithm, and in which a step size parameter is adapted according to characteristics of the encoded signal, the method comprising:
    sampling the step size parameter at a sampling rate to produce an output signal representative of determined step size parameters,
    applying a non-linear, low pass filter to the output signal to form a filtered signal, and
    determining based on the magnitude of the filtered signal whether the encoded signal represents audio activity, and adapting the operation of the communication system based on that determination.

2. A method according to claim 1 wherein the encoded signal is determined to represent audio activity when the magnitude of the step size parameter is above a first threshold.

3. A method according to claim 2 wherein the encoded signal is determined not to represent audio activity when the magnitude of the step size parameter is below the first threshold.

4. A method according to claim 2 wherein the encoded signal is determined not to represent audio activity when the magnitude of the step size parameter is below a second threshold which is lower than the first threshold.

5. A method according to claim 1, comprising analyzing the encoded signal, and determining the step size parameter based on the analysis of the encoded signal.

6. A method according to claim 1 wherein the non-linear low pass filter has an attack time that is faster than the decay time.

7. A method according to claim 6 wherein the sampling rate is less than 1 kHz.

8. A method according to claim 6 wherein the sampling rate is less than 200 Hz.

9. A method according to claim 1, wherein the encoded signal is formed by encoding the audio signal at a transmitter.

10. A method according to claim 1, wherein the step of determining whether the encoded signal represents audio activity is performed at a receiver.

11. A method according to claim 10 wherein the receiver includes an audio output device whereby the audio signal is output, and the method comprises applying a lower gain to signals passed to the output device when the encoded signal is determined not to represent audio activity than when the encoded signal is determined to represent audio activity.

12. A method according to claim 1, wherein the step of determining whether the encoded signal represents audio activity is performed at a transmitter.

13. A method according to claim 12 comprising transmitting the encoded signal when the encoded signal is determined to represent audio activity, and otherwise not transmitting the encoded signal.

14. A method according to claim 12 wherein the transmitter includes a microphone whereby the audio signal is detected, and the method further comprises applying a lower gain to audio signals detected by the microphone when the encoded signal formed by encoding immediately preceding audio signals is determined not to represent audio activity than when the encoded signal is determined to represent audio activity.

15. A method according to claim 1, wherein the communications system is a Bluetooth system.

16. A method for estimating the energy of an audio signal in a communications system in which an audio signal is encoded by a delta modulation encoding algorithm, and in which a step size parameter is adapted according to characteristics of the encoded signal, the method comprising:
    sampling the step size parameter at a sampling rate to produce an output signal representative of determined step size parameters,
    applying a non-linear, low pass filter to the output signal to form a filtered signal, and
    estimating based on the magnitude of the filtered signal the energy of the audio signal.

17. Apparatus for detecting the presence or absence of audio activity in a communications system in which an audio signal is encoded by a delta modulation encoding algorithm, and in which a step size parameter is adapted according to characteristics of the encoded signal, the apparatus comprising:
    a sampler arranged to sample the step size parameter at a sampling rate and produce an output signal representative of determined step size parameters,
    a non-linear, low pass filter arranged to filter the output signal to form a filtered signal,
    a transmitter and a receiver, and
    the apparatus comprising at least one determination unit for determining based on the magnitude of the filtered signal whether the encoded signal represents audio activity, and an adaptation unit for adapting the operation of the communication system based on that determination.

18. Apparatus according to claim 17 wherein the encoded signal is determined to represent audio activity when the magnitude of the step size parameter is above a first threshold.

19. Apparatus according to claim 18 wherein the encoded signal is determined not to represent audio activity when the magnitude of the step size parameter is below the first threshold.

20. Apparatus according to claim 18 wherein the encoded signal is determined not to represent audio activity when the magnitude of the step size parameter is below a second threshold which is lower than the first threshold.

21. Apparatus according to claim 17 further comprising an analyzing unit for analyzing the audio signal and determining the step size parameter based on the analysis of the encoded signal.

22. Apparatus according to claim 17 wherein the non-linear low pass filter has an attack time that is faster than the decay time.

23. Apparatus according to claim 22 wherein the sampling rate is less than 1 kHz.

24. Apparatus according to claim 22 wherein the sampling rate is less than 200 Hz.

25. Apparatus according to claim 17 wherein the transmitter is arranged to form the encoded signal by encoding the audio signal.

26. Apparatus according to claim 17 wherein one of the said at least one determination units is located at the receiver.

27. Apparatus according to claim 26 wherein the receiver includes an audio output device arranged to output audio signals, and the receiver is arranged to apply a lower gain to signals passed to the output device when the encoded signal is determined not to represent audio activity than when the encoded signal is determined to represent audio activity.

28. Apparatus according to claim 17 wherein one of the said at least one the determination unit is located at the transmitter.

29. Apparatus according to claim 28 wherein the transmitter is arranged to transmit the encoded signal if the one of the determination units determines that the encoded signal represents audio activity, and otherwise not to transmit the encoded signal.

30. Apparatus according to claim 28 wherein the transmitter includes a microphone arranged to detect audio signals, and the transmitter is further arranged to apply a lower gain to audio signals detected by the microphone when the encoded signal formed by encoding immediately preceding audio signals is determined not to represent audio activity than when the encoded signal is determined to represent audio activity.

31. Apparatus according to claim 17 wherein the communications system is a Bluetooth system.

32. Apparatus for estimating the energy of an audio signal in a communications system in which an audio signal is encoded by a delta modulation encoding algorithm, and in which a step size parameter is adapted according to characteristics of the encoded signal, and the apparatus comprising:
- a sampler arranged to sample the step size parameter at a sampling rate and produce an output signal representative of determined step size parameters,
- a non-linear, low pass filter arranged to filter the output signal to form a filtered signal, and
- an estimation unit for estimating based on the filtered signal the energy of the audio signal.

* * * * *